United States Patent [19]

Haering

[11] 4,317,876
[45] Mar. 2, 1982

[54] METHOD FOR PRODUCING HIGH RESOLUTION RECORDING MEDIUM

[75] Inventor: Thomas Haering, Munich, Fed. Rep. of Germany

[73] Assignee: Dr. Johannes Heidenhain GmbH, Traunreut, Fed. Rep. of Germany

[21] Appl. No.: 217,516

[22] Filed: Dec. 17, 1980

[30] Foreign Application Priority Data

Dec. 22, 1979 [DE] Fed. Rep. of Germany ....... 2952230

[51] Int. Cl.³ ............................................. G03C 5/00
[52] U.S. Cl. ...................................... 430/293; 430/5;
430/8; 430/324; 430/357; 427/250; 428/206;
428/208; 428/913; 350/166
[58] Field of Search .............. 430/5, 8, 293, 324,
430/357, 395; 427/250; 428/206, 208, 913;
350/166

[56] References Cited

U.S. PATENT DOCUMENTS

| 3,659,098 | 4/1972 | Politycki et al. | 430/357 |
| 3,824,100 | 7/1974 | Griest | 430/5 |
| 4,151,321 | 4/1979 | Hiesinger | 430/5 |
| 4,178,181 | 12/1979 | Sawyer | 430/395 |

Primary Examiner—J. Travis Brown
Attorney, Agent, or Firm—Hume, Clement, Brinks, Willian & Olds, Ltd.

[57] ABSTRACT

A method for producing a high resolution, multi-color recording medium comprises the steps of applying a photosensitive masking layer to a substrate, exposing the masking layer, and then developing the masking layer to expose a patterned portion of the underlying substrate. A reflecting layer is then applied over the remaining masking layer and exposed substrate, and then the remaining masking layer is removed, leaving only that portion of the reflecting layer directly over the substrate. A uniformly thick interference layer is then applied over the substrate and the remaining portion of the reflecting layer, and a second reflecting layer is then applied using the same procedures described above in connection with the first reflecting layer.

3 Claims, 8 Drawing Figures

METHOD FOR PRODUCING HIGH RESOLUTION RECORDING MEDIUM

BACKGROUND OF THE INVENTION

This invention relates to an improved process for producing a high density recording medium, and in particular a high density, multi-color recording medium of the type having at least two inorganic, reflecting layers which are separated by an interference layer formed of an inorganic material which is substantially free of absorption in the visible wavelength range.

U.S. Pat. No. 4,151,321, which is assigned to the assignee of the present invention, discloses a multi-color, high resolution recording medium of the general type described above. As disclosed in the '321 patent, this recording medium includes several reflecting layers which are formed in a high resolution pattern. The process for forming these patterned reflecting layers, as described in the '321 patent, is substantially as follows. First, a reflecting layer is applied either to a substrate or to some material applied to the substrate, and then a photosensitive masking layer is applied to the unpatterned reflecting layer. This masking layer is then exposed in a high resolution pattern, and then developed to expose a patterned portion of the underlying reflective layer. Then the exposed, underlying reflecting layer which is no longer covered with the masking layer is removed, and finally the remaining masking layer is stripped off to expose the desired, patterned reflecting layer.

SUMMARY OF THE INVENTION

The present invention is directed to an improved and simplified process for the production of high resolution recording media of the type described above. According to this invention, a layer of photosensitive masking material is first applied to a surface. This layer of masking material is then exposed in a desired pattern by means of an exposure mask, and is thereupon developed. A layer of a reflective material is then applied to the remaining masking material and to the exposed surface, and then this remaining masking material (together with the reflecting material overlying this masking material) is removed.

The process of this invention brings with it the important advantage that the total number of process steps required to produce a patterned reflective layer is reduced. In particular, the step of removing the remaining photosensitive material automatically accomplishes the desired result of removing a patterned portion of the layer of reflecting material.

The invention itself, together with further objects and attendant advantages, will best be understood by reference to the following detailed description taken in connection with the accompanying drawings.

DETAILED DESCRIPTION OF A PREFERRED EMBODIMENT

Figure 1:
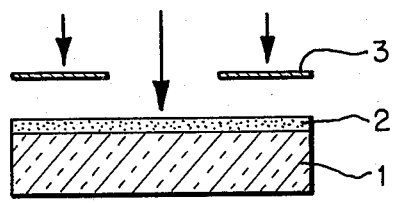
FIGS. 1–8 illustrate consecutive steps in a preferred embodiment of the process of this invention for producing a high resolution recording medium.
Figure 2:
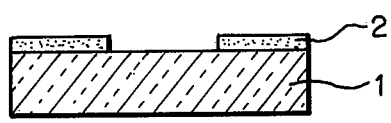

Turning now to the drawings, FIGS. 1–8 illustrate sequential steps in a preferred embodiment of the process of this invention. As shown in FIG. 1, this process begins with a substrate 1 of glass to which is applied a masking layer 2 of a photosensitive masking material, such as a photoresist. An exposure mask 3 is then used to expose a predetermined pattern on the masking layer 2. The exposed masking layer 2 is thereupon developed, as shown in FIG. 2, to remove a patterned portion of the masking layer 2. As shown in FIG. 2, in this preferred embodiment, development of the masking layer 2 causes those portions of the masking layer 2 which have been exposed to be removed. Of course, it should be understood that other types of masking materials operate in reverse such that unexposed portions of the material are removed during the developing step. As used herein, the term "developing" is to be understood broadly to cover the use of either type of masking material.

Figure 3:
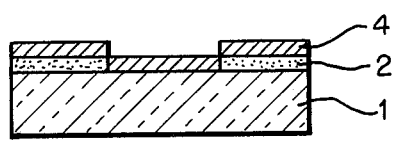
Figure 4:
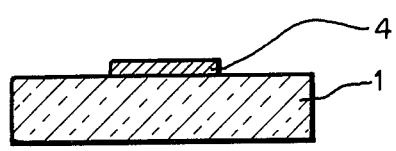
Figure 5:
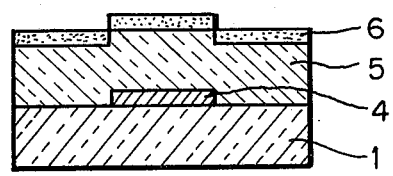

Once the masking layer 2 has been developed, a reflecting layer 4 of an inorganic reflecting material, such as silver, for example, is applied to the remaining masking layer 2 and to the exposed substrate 1, as shown in FIG. 3. Then, as shown in FIG. 4, the remaining masking layer 2 is removed from the substrate 1, thereby removing that portion of the reflecting layer 4 which was deposited over the remaining masking layer 2. At this stage in the process a patterned portion of the reflecting layer 4 is left over the substrate 1, and all parts of the reflecting layer 2 have been removed.

The next step in the process of this preferred embodiment is to apply a uniformly thick interference layer 5 over the substrate 1 and the remaining portions of the reflecting layer 4. Preferably, this interference layer 5 is formed of an inorganic material which is substantially free of absorption in the visible wavelength range of the spectrum. After the interference layer 5 has been deposited, it is then covered with an additional masking layer 6 formed of a photosensitive masking material. See FIG. 5.

Figure 6:
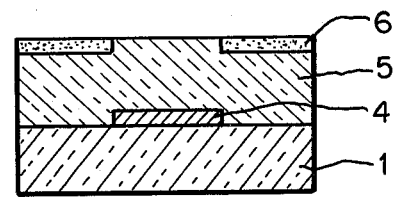

This masking layer 6 is then exposed in a predetermined pattern by means of the same exposure mask 3 as shown in FIG. 1 and described above. After the masking layer 6 has been exposed, it is then developed to remove that portion of the masking layer 6 which overlies the remaining portion of the reflecting layer 4. FIG. 6 shows the structure of the partially fabricated recording medium following the developing of the masking layer 6.

Figure 7:
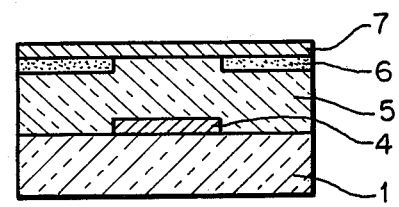
Figure 8:
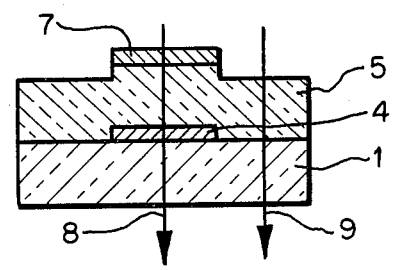

The next step in the process of this preferred embodiment is to apply an additional reflecting layer 7 over the remaining portion of the masking layer 6 and the exposed portion of the interference layer 5, as shown in FIG. 7. Then the remaining masking layer 6 is removed, together with that portion of the reflecting layer 7 which overlies the remaining masking layer 6. FIG. 8 shows a portion of the recording medium as it appears following removal of the remaining masking layer 6.

The recording medium shown in FIG. 8 is in fact a micro-interference filter. The color hue of this recording medium is determined by the thickness of the interference layer 5. For example, the thickness of the interference layer 5 can be selected to produce the color hue blue in the region of the arrow 8. The saturation of this color hue is determined in the zone of the arrow 8 by the thickness, and therefore the reflectivity, of the two spaced reflecting layers 4, 7. In the zone of the arrow 9, the emerging light is not modified as to color, since the substrate 1 and the interference layer 5 are substantially free of absorption in the visible range, and no reflecting layers 4, 7 appear in this zone.

The sequence of two reflecting layers 4,7 separated by an interference layer 5 of predetermined thickness forms a micro-interference filter, in this example having a color hue blue with a predetermined color saturation. By arranging such interference filters adjacent one another on a substrate there can be generated any desired color hues with any desired color saturation adjacent one another. By arranging such interference filters over one another on a substrate there can be produced color hues with any desired color saturation by multiplicative color tone mixing. U.S. Pat. 4,151,321 is hereby incorporated by reference for its description of the structure and operation of such filters.

In the embodiment described above, the reflecting layers 4,7 can be generated, for example, by vapor deposition in a high vacuum or by cathode atomization. In the latter process, however, there takes place a decrease of the solubility of the respective masking layers 2,6 caused by a hardening and cross-linking of the masking layers 2,6 as a consequence of high energy particle bombardment. Since, however, the reflecting layers 4,7 act to shield the respective underlying masking layers 2,6 as the reflecting layers 4,7 increase in thickness, the underlying masking layer 2,6 is shielded to a large extent from bombardment from high energy particles. This shielding effect acts to reduce the hardening and cross-linking of the underlying masking layers 2,6 to such a degree that the problem of hardened masking material is substantially eliminated. In this way, excellent solubility of the masking material in appropriate solvents is insured.

The embodiment described above reduces the total number of processing steps by one with respect to the process described in U.S. Pat. No. 4,151,321.

Of course, it should be understood that various changes and modifications to the preferred embodiment described above will be apparent to those skilled in the art. It is therefore intended that the scope of the present invention be defined by the following claims, including all equivalents, rather than by the exemplary embodiment described above.

I claim:

1. A process for producing a high resolution recording medium comprising the following steps:
    (a) providing a substrate;
    (b) applying a first masking layer to the substrate;
    (c) exposing a patterned portion of the first masking layer; then
    (d) developing the first masking layer;
    (e) applying a first reflecting layer over the remaining portion of the first masking layer;
    (f) removing the remaining portion of the first masking layer and the portion of the first reflecting layer overlying the remaining portion of the first masking layer;
    (g) applying a uniformly thick interference layer over the remaining portion of the first reflecting layer, said interference layer substantially absorption free in the visible portion of the spectrum;
    (h) applying a second masking layer to the interference layer;
    (i) exposing a patterned portion of the second masking layer; then
    (j) developing the second masking layer;
    (k) applying at least a second reflecting layer over the remaining portion of the second masking layer; and then
    (l) removing the remaining portion of the second masking layer and the portion of the second reflecting layer overlying the remaining portion of the second masking layer;
    said first and second reflecting layers and said interference layer comprising inorganic materials, the thickness of said interference layer selected such that the combination of the first reflective layer, the interference layer and the second reflective layer cooperate to form a patterned interference filter.

2. The process of claim 1 where at least one of steps (e), (g) and (k) comprises the step of vapor depositing the respective layer in a high vacuum.

3. The process of claim 1 wherein at least one of steps (e), (g) and (k) comprises the step of using cathode atomization techniques to apply the respective layer.

* * * * *